(12) United States Patent
Bedarida et al.

(10) Patent No.: US 7,826,291 B2
(45) Date of Patent: Nov. 2, 2010

(54) PRECHARGE AND EVALUATION PHASE CIRCUITS FOR SENSE AMPLIFIERS

(75) Inventors: Lorenzo Bedarida, Vimercate (IT);
Fabio Tassan Caser, Arcore (IT);
Mauro Chinosi, Burago di Molgora (IT); Donato Ferrario, Carugate (IT)

(73) Assignee: Atmel Corporation, San Jose, CA (US)

( * ) Notice: Subject to any disclaimer, the term of this patent is extended or adjusted under 35 U.S.C. 154(b) by 280 days.

(21) Appl. No.: 12/174,307

(22) Filed: Jul. 16, 2008

(65) Prior Publication Data

US 2010/0014370 A1 Jan. 21, 2010

(51) Int. Cl.
*G11C 7/00* (2006.01)

(52) U.S. Cl. ...................... 365/203; 365/207
(58) Field of Classification Search ............... 365/203, 365/207, 201
See application file for complete search history.

(56) References Cited

U.S. PATENT DOCUMENTS

| 6,108,256 A | * | 8/2000 | Schneider | 365/203 |
| 6,856,547 B2 | * | 2/2005 | Poidomani et al. | 365/185.21 |
| 7,088,626 B2 | * | 8/2006 | Mori et al. | 365/189.11 |

* cited by examiner

*Primary Examiner*—Anh Phung
(74) *Attorney, Agent, or Firm*—Schwegman, Lundberg & Woessner, P.A.

(57) ABSTRACT

A precharge and evaluation circuit for a memory sense amplifier includes a first precharge-phase transistor having a source coupled to a power-supply potential, a gate coupled to a precharge control line, and a drain. A second precharge-phase transistor has a drain coupled to the drain of the first precharge-phase transistor, a source, and a gate coupled to the source through a feedback circuit. A first read-phase transistor has a source coupled to the power-supply potential, and a gate and drain coupled to a comparator. A second read-phase transistor has a drain coupled to the drain of the first read-phase transistor, a source coupled to the source of the second precharge-phase transistor, and a gate coupled to the source of the second read-phase transistor through a feedback circuit. A column decoder is coupled to the sources of the second precharge-phase and second read-phase transistors.

12 Claims, 7 Drawing Sheets

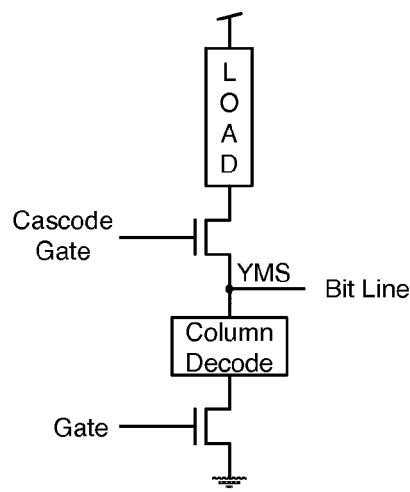
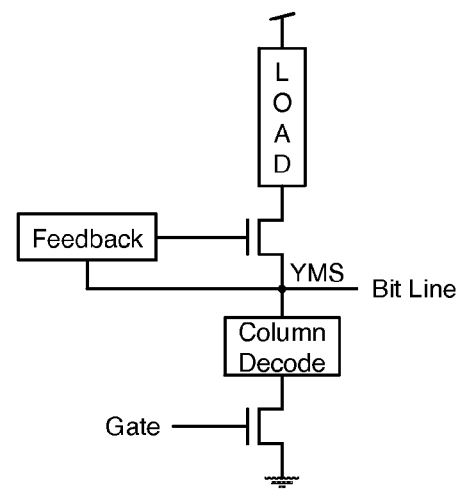
FIGURE 1A
(PRIOR ART)
FIGURE 1B
(PRIOR ART)
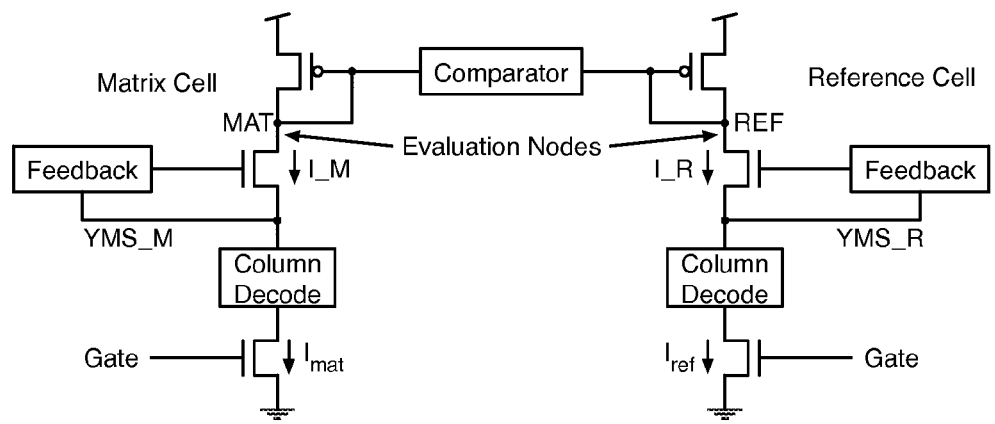
FIGURE 2
(PRIOR ART)

PRECHARGE AND EVALUATION PHASE CIRCUITS FOR SENSE AMPLIFIERS

BACKGROUND OF THE INVENTION

1. Field of the Invention

The present invention relates to precharge and evaluation circuits for memory sense amplifiers.

2. Related Art

In order to correctly read the data item from a memory cell of a memory matrix, it is customary to compare the current read from the memory matrix cell with the current read from a reference matrix cell or with a reference current, in order to detect the difference between a programmed cell and an erased cell.

For this purpose, memory matrices are usually configured so that reading data from a memory cell is performed by comparing a current that flows across a reference matrix cell (or a reference current) with the current of the selected cell. The difference between the two currents determines the value of the data. If the matrix cell current is higher than reference current then the stored data is a "one" bit; otherwise it is a zero bit.

To get the correct current flowing the selected cells, the drains of the memory transistors associated with a selected column/bitline have to be correctly polarized, as do the gates of the memory transistors associated with a selected row.

A standard approach to bias the drain of a memory cell is to employ cascode circuitry such as is shown in FIGS. 1A and 1B. The YMS signal is connected by the column decoder to the selected bitline coupled to the selected flash cell drain. A load (resistor, p-channel transistor, current source, etc.) is used to sink current to the bitline of the flash cell, passing through the control of the cascode transistor that defines the YMS value.

This circuitry has to guaranty to provide the correct flash cell drain value (about 1V) as soon as possible and to prevent the flash cell drain from being over this value in order to prevent a soft writing problem.

The value of the voltage at the gate of the cascode transistor limits maximum value of YMS (that is at its source) and so limits the maximum value of the voltage on the selected bitline that is connected to it through the column decoder. The voltage at the gate of the cascode transistor can be obtained as a fixed voltage as shown in FIG. 1A, for example using a voltage reference, or by using feedback circuitry having the YMS signal (that is similar to Bitline value) as an input as shown in FIG. 1B. This kind of circuitry is usually used to precharge both the selected matrix cell drain and the reference cell drain. Fast polarization of flash cells allows fast access time and improves performance.

An illustrative conventional standard sense amplifier is shown in FIG. 2. The diode-connected p-channel transistors are used as loads to charge the matrix and reference bit lines. These devices may also be used to compare the flash cell current and the reference cell current by mirroring these currents in a mirror comparator. The drain nodes of the p-channel transistors are sometimes referred to as evaluation nodes (labeled "MAT" and "REF" to designate the matrix and reference evaluation nodes, respectively).

Flash memory cells usually sink a very low current, but their drains are almost always coupled to a very long bitline having a high inherent capacitance that has to be charged to the target value quickly to meet the memory access time specification. To solve this problem, large transistors are often used because they are able to sink the current necessary to precharge this large capacitance. This presents another drawback due to their dimensions and their terminal capacitance, making the evaluation nodes very slow during evaluation mode where the currents are very low.

An illustrative conventional current mirror sense amplifier (a very basic scheme) having a cascode device with feedback circuitry as shown in FIG. 2 will be described. FIG. 2 illustrates a very basic current mirror sense amplifier having a local reference but persons skilled in the art will appreciate that the same issues will arise when a global reference that can be obtained in any different way, for example a current generator, is employed.

The leftmost p-channel transistor is used to furnish current to the bitline of the flash cell, passing through the control of its associated cascode transistor. The rightmost p-channel transistor is used to furnish current to the bitline of the reference cell, passing through the control of the reference cascode transistor.

In the current mirror sense amplifier shown in FIG. 2, the two p-channel transistors are shown in diode configuration, but could also be in other configurations such as mirror configuration. The two Cascode transistors have their gates controlled by feedback circuitry with input values YMS_M and YMS_R, respectively. YMS_M is connected by the column decoder to the selected matrix cell bitline/drain and YMS_R is connected by a dummy column decoder to the reference bitline/drain.

The most simple feedback circuitry may be an inverter but is usually more complex. When the selected matrix flash and reference cell are correctly polarized to their static values, in gate and drain, they sink respectively a current $I_{mat}$ in the matrix cell and a current $I_{ref}$ in the reference cell, and diode-connected p-channel matrix transistor current I_M is equal to $I_{mat}$ while the diode-connected p-channel reference transistor current I_R is equal to $I_{ref}$. Before settling to static values, diode-connected p-channel matrix and reference transistors must also furnish the transient currents needed to charge the bitlines to the correct values.

Before getting static values I_M=$I_{mat}$+$I_{cmat}$ and I_R=$I_{ref}$+$I_{cref}$, where $I_{cmat}$ and $I_{cref}$ represent the total transient capacitance component related respectively to the reference column path and to the matrix column path. The capacitance of the bitlines is very large and so the current $I_{cmat}$ needed to precharge it is very high, while flash current $I_{mat}$ is very low. Only the issue of precharging the bitlines will be considered in this analysis. Static values are obtained when $I_{cmat}$≈0 and $I_{cref}$≈0.

There are usually two basic phases in this kind of sensing operation. The first is a precharge phase, during which the flash cell terminals are polarized to the target value. The next phase is the evaluation phase where the flash cell status (zero or one bit for single level) is detected by comparing the currents I_M (that should be ≈$I_{mat}$ in this phase) and I_R (that should be ≈$I_{ref}$ in this phase). If $I_{mat}$ is less than $I_{ref}$, the flash cell has to be evaluated as containing a "0" bit. If $I_{mat}$ is more than $I_{ref}$, the flash cell has to be evaluated as containing a "1" bit.

The sensing operation performs a comparison between I_M=$I_{mat}$+$I_{cmat}$ and I_R=$I_{ref}$+$I_{cref}$. Therefore, the sense operation performs correctly if done during the evaluation phase when $I_{mat}$<$I_{ref}$,I_M is less than I_R and if done during the evaluation phase when $I_{mat}$>$I_{ref}$,I_M is greater than I_R. If transient (i.e., capacitive) currents are not negligible during the evaluation phase these current relationships may not be true and the sense operation could fail. In particular in the case in which $I_{cmat}$>$I_{cref}$ and is compared to $I_{ref}$, the result could be I_M=$I_{mat+Icmat}$>I_R=$I_{ref}$+$I_{cref}$, even if $I_{mat}$=0, thus erroneously detecting a "0" bit as "1" bit.

This is particularly critical in the case in which large diode-connected and cascode transistors are used, because when the selected cell contains a "0" bit, to sense the correct information the current I_M that flows through these transistors has to become close to zero during the evaluation phase, but due to the large transistor dimensions they take a long time to reach their turn-off point. This time often is not acceptable when a fast access time is required.

It is very important to start the evaluation phase when $I_{cmat}$ and $I_{cref}$ are negligible especially in the case in which $I_{cmat}$ is different from $I_{cref}$, so that the precharge phase has to be very fast to achieve a fast access time. To do this a very high current has to be furnished to the high capacitance bitlines by the sense circuitry.

The bitline/drain of the selected matrix flash cell is biased through the current flowing through the matrix diode-connected transistor and it is biased by the control of the matrix cascode transistor to a value that usually is in the range of about of 1V. The same happens for reference side through the reference diode-connected transistor and the reference cascode transistor. After this precharge phase, the p-channel matrix diode-connected transistor should sink the same current $I_{mat}$ of the selected flash cell and the reference diode-connected transistor should sink the same current $I_{ref}$ of the flash reference cell. Because both p-channel transistors are connected in diode configuration they operate in their saturation region. Therefore, as first approximation their current follows the following relationship:

$$Id = K*W/L*(VGS-VTHp)^2. \qquad (1)$$

where W is the width, L is the length and K is a typical process parameter of the transistor. VGS is the voltage between the source and the gate. VTHp is the p-channel threshold voltage. In this case the matrix and reference transistors are considered to be identical but of course they could be different.

The source voltage for both transistors is the supply voltage $V_{DD}$. The gate of the p-channel matrix diode-connected transistor is at a voltage VMAT, while the gate of the p-channel reference diode-connected transistor is at a voltage VREF. These connections are the evaluation nodes (MAT and REF) of the circuit. To detect the cell information a comparator is used having its inputs connected to the evaluation nodes at the gate/drain connections of the p-channel matrix diode-connected transistor and the p-channel reference diode-connected transistor.

A sensing circuit using an illustrative comparator is shown in FIG. 3. In this case transistor P1 is coupled to mirror the current of the matrix diode-connected transistor and transistor P2 is coupled to mirror the current of the reference diode-connected transistor. For simplicity assume that P1 and P2 have the same dimensions as the diode-connected transistors. Accordingly, P1 sinks statically a current equal to $I_{mat}$, and P2 sinks statically a current equal to $I_{ref}$.

The diode-connected p-channel transistors have to furnish very high current to quickly precharge the large capacitance associated with long bitlines, and working in mirror configuration they need to have a long length L to minimize any possible mirroring error. For these reasons they are very large and have high gate capacitance. Consequently p-channel transistors P1 and P2 are also very large. The large W and L cause their gate capacitance to be very high, with the result that the evaluation nodes that are respectively connected to the gates of the p-channel diode connected transistors and transistors P1 and P2, present a load having a large capacitance. This slows the sense process, because the currents $I_{mat}$ and $I_{ref}$ are very low and take a significant amount of time to move the voltages at these high-capacitance evaluation nodes.

Finally, the increasing of the voltages at the evaluation nodes to reach their target values dramatically reduces the current that the diode-connected transistors are able to sink. According relationship (1):

$$I\_M = K*Wm/Lm*((VDD-VMAT-VTHp)^2 I\_$$
$$R = K*Wr/Lr*((VDD-VREF-VTHp)^2$$

where Wm, Lm are the width and length of the p-channel matrix diode-connected transistor and Wr and Lr are the width and length of the p-channel reference diode-connected transistor.

The higher the voltages VMAT and VREF, the lower the currents through the p-channel matrix and reference diode-connected transistors that are needed to charge the bitlines. This is particularly critical especially during the last part of the precharge phase, that for this reason can take a long time. Moreover, the matrix and reference cascode transistors need to be very large because they also have to be able, for the same reasons, to furnish a very high current to quickly complete the precharge phase.

Several solutions have been used to solve this problem. One such solution is illustrated in FIG. 4 in which a parallel precharge path is added to the sense amplifier. This parallel path includes one p-channel precharge transistor connected to the matrix evaluation node (MAT) and another p-channel precharge transistor is connected to the reference evaluation node (REF). Their gates are coupled to ground during the precharge phase to turn them on during the precharge phase. In this way the precharge current is augmented during the precharge phase since these additional transistors can sink high current during the precharge phase.

The precharge transistors are on for a period defined by the additional control signal Prech that is tied to ground during this period and that is tied to $V_{DD}$ during the evaluation phase to turn off the precharge transistors. In this way it is possible to furnish all the current needed to quickly bias the bitlines without the issue of significant current reduction due to the voltage rise at the evaluation nodes.

The solution shown in FIG. 4 speeds up the precharge phase but has the drawback that there is a significant risk that the evaluation nodes are biased at values that are too high with respect the target values at the end of the precharge phase. It is very difficult to find the correct duration of this new phase to avoid this problem. Since only low currents flow during the evaluation phase, the evaluation nodes still need to be discharged to the correct values after the precharge phase, a finite time is needed and a sensing error can thus occur.

Other parallel precharge solutions using transistors having different thresholds have been proposed to avoid this risk, but such solutions are not efficient enough to allow significant reduction of the sizes of the p-channel diode-connected transistors and to reduce access time.

BRIEF DESCRIPTION

According to the present invention, better control of the precharge and evaluation phases is exerted, allowing the use of significantly smaller transistors, thus reducing sense-circuit die area and increasing read performance.

According to the present invention, the sense-amplifier circuitry is split such that a part of circuitry is principally used/optimized for high currents (in particular the precharge phase) and another part is principally used/optimized for low currents (in particular the evaluation phase). In this way it is possible to optimize the characteristics of each circuit, minimize area, speed up access time, allowing all transistors to work in their best polarization point. The approach of the present invention is useful for sense amplifiers generally and not only for the one disclosed herein. The concept of the present invention may be applied to any kind of sense amplifier.

Moreover even if involved currents may be significantly different according to the sense architecture and to the kind of flash memory this approach can be, in any case, easily adapted and optimized, that is, for example one part may be optimized for high/medium currents and the other one for low/medium currents or the different optimized parts can be several, one optimized for high current, another for medium currents another for low currents, any combination of these kinds of circuitry can be easily obtained.

BRIEF DESCRIPTION OF THE DRAWING FIGURES

FIGS. 1A and 1B are diagrams illustrating a prior-art approach for biasing the drain of a memory cell using cascode circuitry.

FIG. 2 is a diagram showing an illustrative prior-art sense amplifier.

DETAILED DESCRIPTION

Persons of ordinary skill in the art will realize that the following description of the present invention is illustrative only and not in any way limiting. Other embodiments of the invention will readily suggest themselves to such skilled persons.

The overall goal is to increase speed/performance and to significantly reduce the die area of the sense amplifier while being careful to avoid over biasing the evaluation nodes (MAT, REF) and the cascode feedback inputs YMS_M, YMS_R and being able to get them very close to their correct values at the end of precharge phase. A sense amplifier according to the present invention includes minimized/optimized precharge circuitry that is able to quickly precharge the bitlines with minimized/optimized precharge circuitry, must minimize/optimize the evaluation p-channel transistors, must minimize/optimize the comparator transistors of both polarities, and also minimizes/optimizes cascode transistors. An important target is to obtain these aims maintaining a very good control of critical nodes, as evaluation nodes MAT and REF, and cascode feedback inputs YMS_M and YMS_R. Without sufficient control of all these nodes, read errors could result as well as a reliability problem due to undesired YMS node voltage overshoot.

In the standard approach typified by FIG. 2, the diode-connected matrix transistor (as well as the diode-connected reference transistor) has to furnish high current to the memory cell and the bit line to which it is connected during the precharge phase. This transistor must also furnish current to the memory cell and bit line during the evaluation phase when current is very low. In the evaluation phase, this transistor must operate near its turn-off bias point and so it is very slow and it takes a long time for the voltage to reach that value. As previously mentioned, its diode configuration and large area are not optimized for both the high-current precharge and low-current evaluation phases.

The large diode-connected p-channel transistors and cascode transistors are used to quickly charge the bitlines and evaluation nodes to their correct bias points. The currents through these diode-connected transistors are mirrored to a mirror comparator that is used during the evaluation phase. These transistors could be significantly smaller during the evaluation of the cell currents because flash current is very small. The same thing is true for the cascode transistors that define the correct values of YMS_R and YMS_M.

The present invention involves splitting the high-current precharge path and the low-current evaluation path, while maintaining good control of the YMS nodes and the evaluation nodes during both the precharge and evaluation phases.

Figure 5:
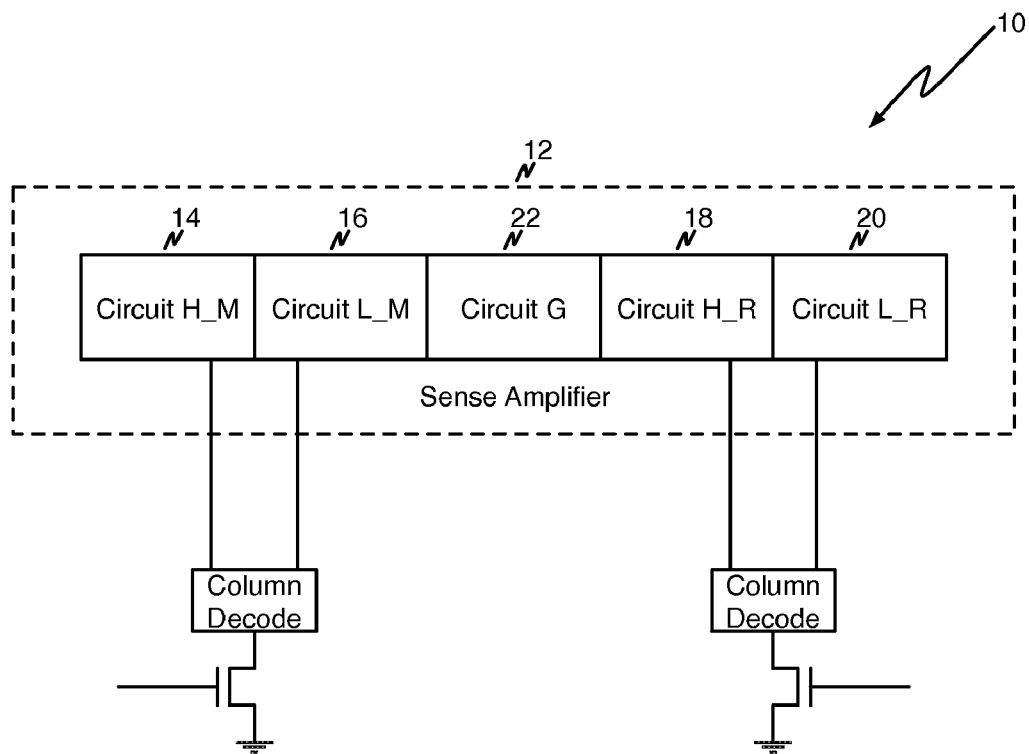
FIG. 5 is a combination schematic and block diagram showing an illustrative embodiment of a sensing scheme according to one aspect of the present invention.

Referring now to FIG. 5, an illustrative embodiment of sense circuitry 10 according to the present invention is shown in combination block-diagram and schematic form. As may be seen from an examination of FIG. 5, the circuitry in sense amplifier 12 has been divided into segments, each of which has been optimized according to the best use. Circuit H_M (identified at reference numeral 14) is the circuitry optimized for the high-current precharge phase in the matrix side. Circuit L_M (identified at reference numeral 16) is the circuitry optimized for the low-current evaluation phase in the matrix side. Similarly, Circuit H_R (identified at reference numeral 18) is the circuitry optimized for the high-current precharge phase in the reference side and Circuit L_R (identified at reference numeral 20) is the circuitry optimized for the low-current evaluation phase in the matrix side. Circuit G (identified at reference numeral 22) is the common circuitry that is optimized according to the current value.

Figure 6:
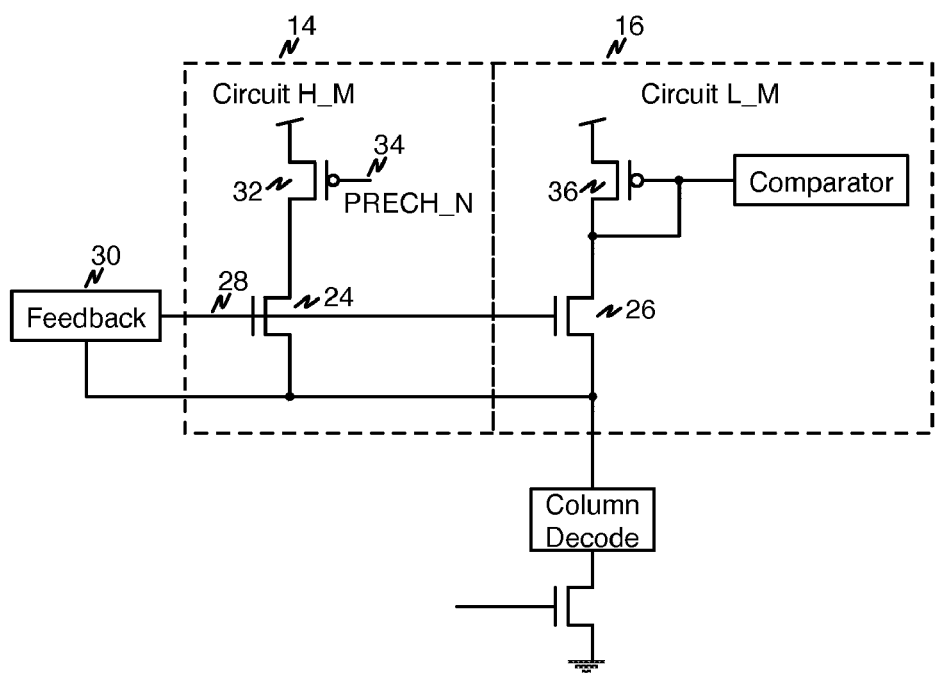
FIG. 6 is a diagram showing in more detail an illustrative embodiment of a sensing scheme like that of FIG. 5 according to another aspect of the present invention.

Referring now to FIG. 6, a possible matrix portion of the sense amplifier circuit of FIG. 5 is shown, although persons of ordinary skill in the art will appreciate that the same considerations apply to the H_R and L_R circuits on the reference side. FIG. 6 illustrates a simple case, but this solution is valid for any kind of sense amplifier, with or without feedback, with any kind of architecture and with any kind of reference. As shown in FIG. 6, Circuit H_M (reference numeral 14) is optimized for high currents and Circuit L_M (reference numeral 16) is optimized for low currents.

As may be seen from an examination of FIG. 6, the single cascode transistor used to fix the voltage of the high capacitance YMS_M node has been replaced by two smaller transistors 24 and 26, sharing a common gate line 28 coupled to the output of feedback circuit 30. Transistor 24 shares its gate and source with transistor 26 but has its drain coupled to the source of p-channel transistor 32 that has its drain connected to $V_{DD}$. P-channel transistor 32 has its gate coupled to a signal PRECH_N at reference numeral 34. Transistor 26 belongs to Circuit L_M 16 and is connected the same way as the cascode transistor in the prior-art arrangement of FIG. 2. Transistor 26 has its drain coupled to the drain of transistor 36. Transistor 24 operates during the precharge phase and belongs to Circuit H_M 14 optimized for high currents. Transistors 26 and 36 are always operating, and are especially (or only) useful during the evaluation phase.

Figure 7:
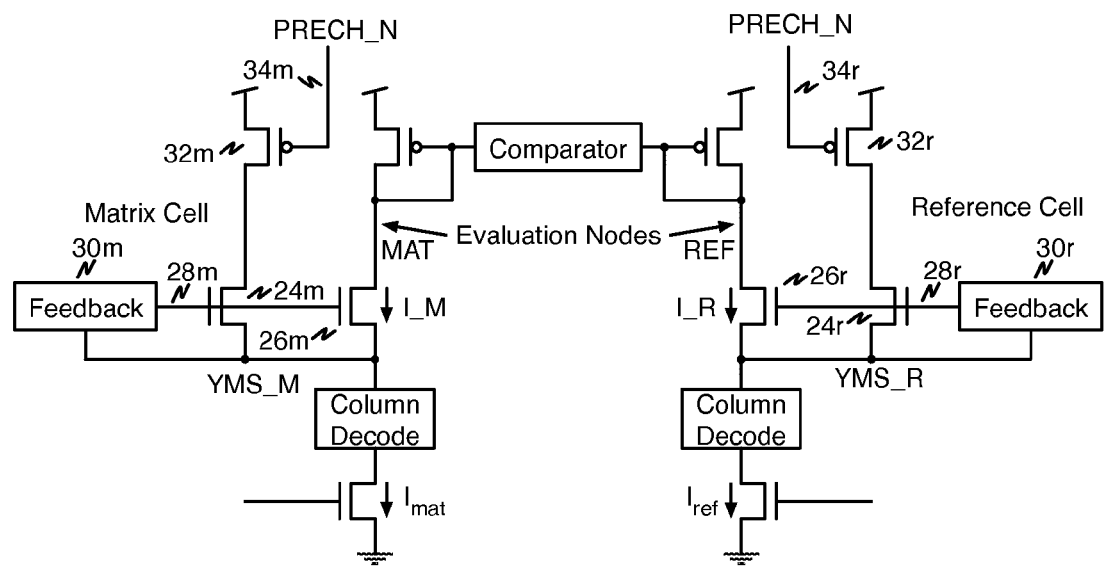
FIG. 7 is a diagram showing the use of the circuit of FIG. 6 on both the matrix cell and reference cell sense circuits.

FIG. 7 shows the use of the circuit of FIG. 6 on both the matrix cell and reference cell sense circuits. The reference numerals used in FIG. 7 are the same as the reference numerals used in FIG. 6, with the addition of the suffixes "m" and "r" for matrix and reference cells, respectively.

Figure 8:
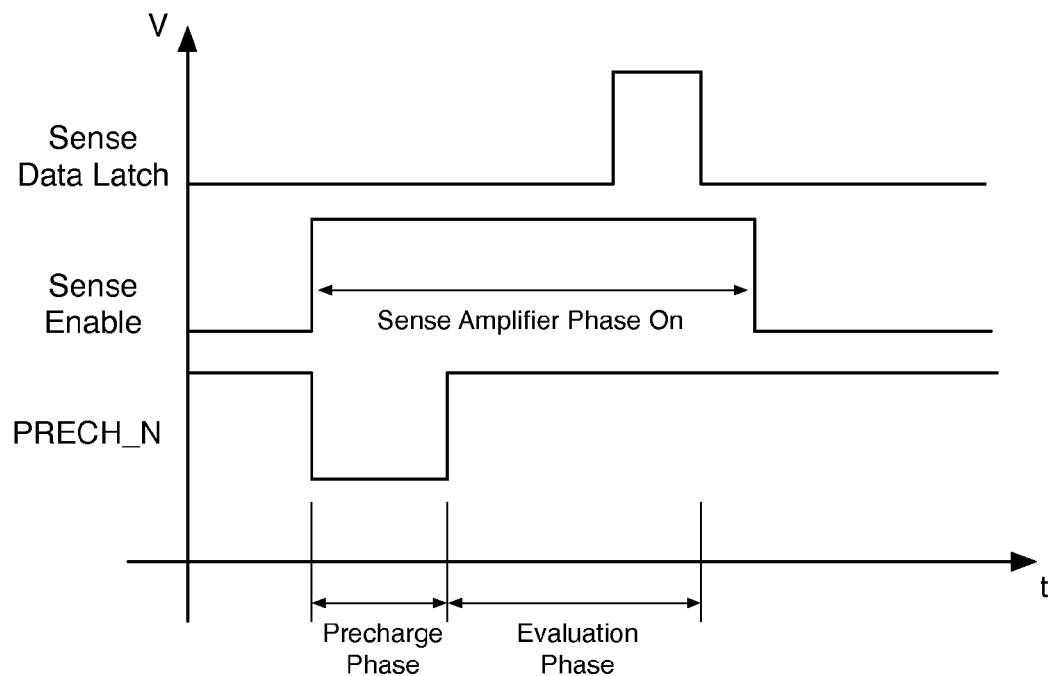
FIG. 8 is a timing diagram showing an illustrative embodiment of a sensing scheme according to the present invention.

An illustrative timing for the signal PRECH_N is shown in FIG. 8. The precharge signal could be different for the matrix and reference sides, but for simplicity the same signal PRECH_N is shown for both. From FIG. 8 it may be seen that transistors 24 and 32 are turned on only during the precharge phase. The sense phase is the entire period during which the signal SENSE ENABLE is high and, in this example, includes two phases a precharge phase, whose duration is indicated by PRECH_N signal low and an evaluation phase that is the period between the end of the precharge phase and the end of the sense data latch. The signal PRECH_N can be generated as a logic fixed phase or by analog detecting circuitry or both.

Figure 3:
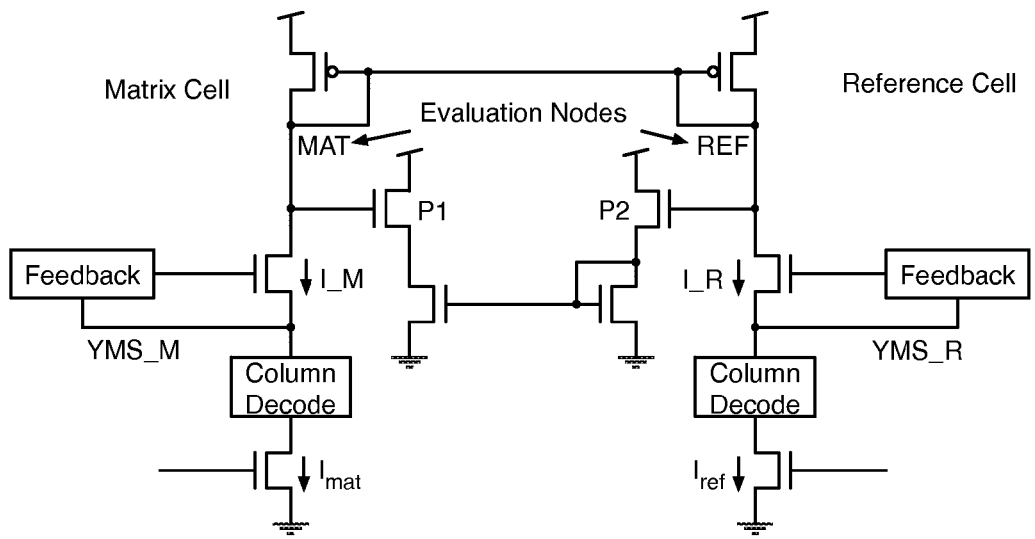
FIG. 3 is a diagram showing a prior-art sensing circuit like that of FIG. 1 employing an illustrative comparator.
Figure 4:
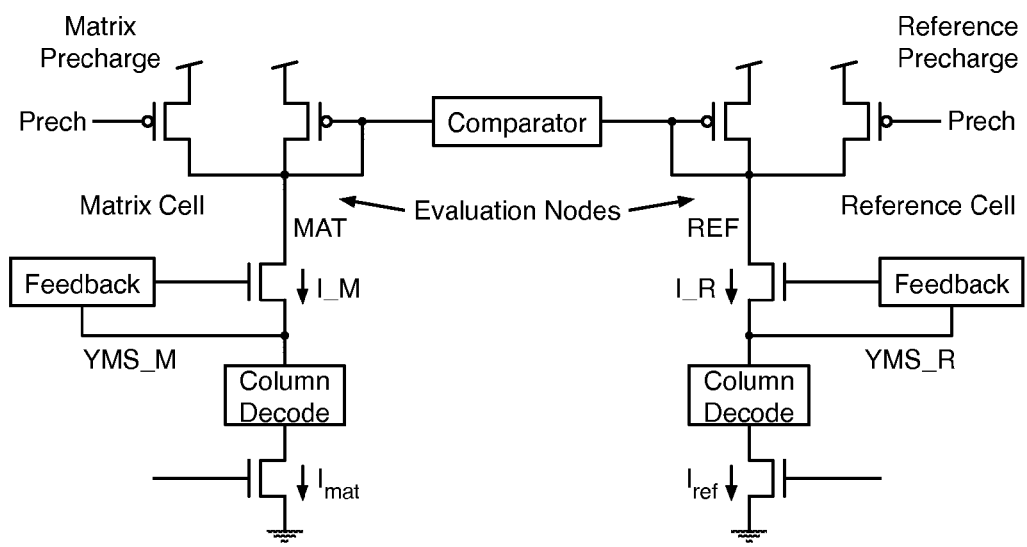
FIG. 4 is a diagram showing one prior-art precharge solution in which a parallel precharge path is added to the sense amplifier.

The configuration of p-channel transistor 32 has several advantages over the use of a p-channel transistor in diode configuration. It is turned on with its gate grounded, so that it can furnish higher current than could a diode-connected p-channel transistor for the entire precharge phase and in particular near the end of the precharge phase where the current of a diode-connected p-channel transistor would be reduced by raising of its gate voltage. Because transistor 32 is not used to mirror current it can have minimum length, unlike the p-channel transistor in FIG. 2 that is used for mirroring current that has a longer length to reduce the early effect. Using a minimum length transistor allows providing higher current using less area. Transistor 32 is not connected directly to the evaluation node so that there is no risk of overbiasing the evaluation node as would be the case in the alternative standard approach shown in FIG. 4. Moreover, because it is not connected directly to the evaluation node transistor 32 does not add capacitance to the evaluation node.

The phase signal PRECH_N needed to control transistor 32 is less complex than alternative standard approach because there is no risk of overcharging the node YMS_M. Further, because the added precharge path is not connected to the evaluation node, even if the new phase signal PRECH_N was active for too long a time it would not cause errors in the evaluation phase as might happen with the standard approach.

There are several global advantages to using the scheme of the present invention. The p-channel transistors used in diode configuration (e.g., transistor 36 of FIG. 6) are principally (or only) used for the evaluation phase and have to sink only a low current (comparable to flash current). Thus, these transistors can be significantly smaller, reducing the sense area. Moreover with reduced dimensions these transistors operate significantly better during the evaluation phase where low currents are involved. In this way these transistors can be optimized for operation at their best bias points for evaluation phase currents, significantly speeding up their performance. This is a significant improvement over the prior art where the same transistors are used to furnish a low current for the evaluation phase are the same large and slow transistors used to furnish a very high current during the precharge phase and are thus not optimized for the low evaluation phase currents. In addition, sizes of the p-channel transistors in mirror configuration inside the comparator, whose dimensions are function of the sizes of the diode-connected p-channel transistors, can consequently also be significantly reduced.

The additional precharge path provided by the present invention is very small because the p-channel transistor 32 can have the minimum length. Because the transistor turns on with its gate grounded, it sinks a significantly higher current than does the larger diode-connected p-channel transistor used in the prior art. Moreover, it works efficiently for the entire precharge phase as compared with the prior-art diode-connected p-channel transistor. Use of smaller evaluation transistors in the sense amplifier and the comparator result in lower evaluation node capacitance and better performance. The circuitry is smaller, more optimized and works at the optimum bias point. Adding an additional path allows the use of smaller n-channel cascode transistors, reducing the evaluation node capacitance even further.

As previously noted, there are several ways to generate the signal PRECH_N. One way already described is to generate this signal using a logic phase to set its duration. It is also possible to generate it by using analog detector circuitry or by a combination of the output of analog detector circuitry and a logical phase.

A possible analog implementation that may be used to define the duration of signal PRECH_N of the present invention is to provide analog circuitry to control, with or without a logical signal, the time in which the added path has to be operable. In this way it is possible to better control and to more efficiently turn on this additional path.

Figure 9:
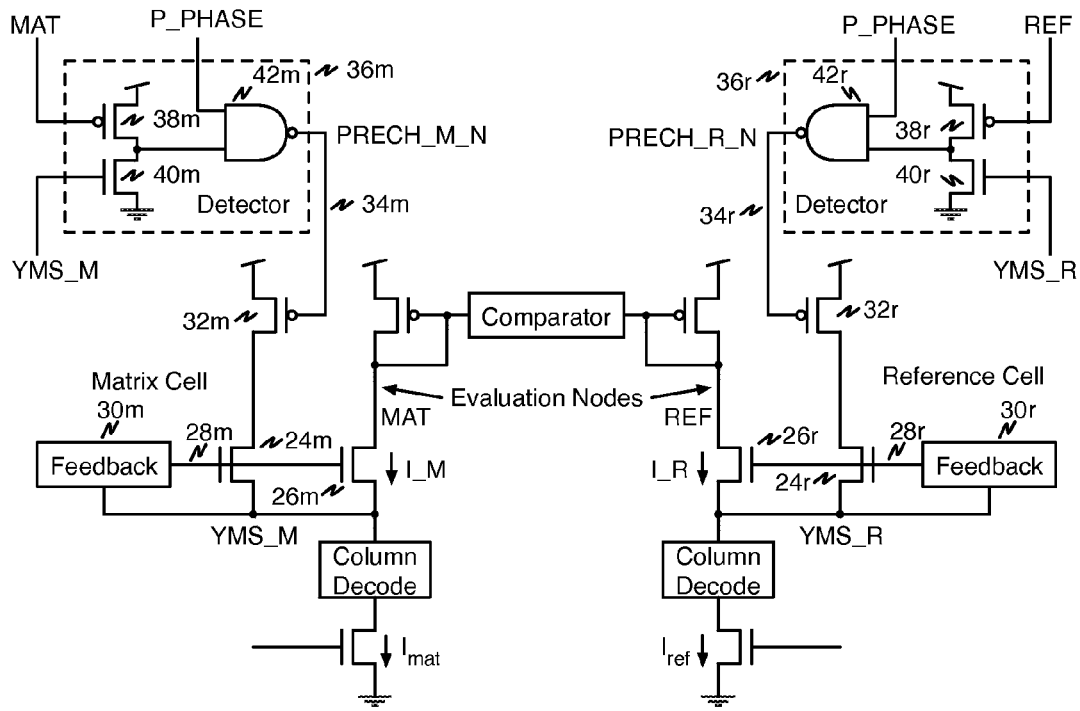
FIG. 9 is a diagram showing an illustrative embodiment of a sensing scheme according to the present invention including detector circuits according to another aspect of the present invention.

The analog circuitry detects when the evaluation nodes (MAT, REF), the YMS_M and YMS_R nodes or both have been precharged to the correct value and then turns off (alone or together with a logical signal P_PHASE) the additional precharge path. FIG. 9 shows a possible implementation of detector circuits 36m and 36r, in which YMS_M, YMS_R, MAT, and REF are checked (but only one of these could be used). In this case when signal MAT and YMS_M reach their target values then DETECT circuitry forces the PRECH_M_N signal high to turn off p-channel transistor 32m. Similarly, when signal REF and YMS_R reach their target values then DETECT circuitry forces the PRECH_R_N signal high to turn off p-channel transistor 32r. As shown in FIG. 9, this phase could be also controlled together with a logical signal P_PHASE. Persons of ordinary skill in the art will appreciate that either only one or both of these signals may be used.

An illustrative implementation of detector circuits 36m and 36r is shown in FIG. 9. As one of the possible examples, the matrix-side DETECT circuitry includes p-channel transistor 38m in series with n-channel transistor 40m. The gate of p-channel transistor 38m is coupled to the MAT evaluation node and the gate of n-channel transistor 40m is coupled to the signal YMS_M. The common drain connection of transistors 38m and 40m is connected to one input of NAND gate 42m. The logical signal P_PHASE is connected to the other input of NAND gate 42m. NAND gate 42m generates the signal PRECH_M_N.

Initially, nodes MAT and YMS_M are grounded, so that the common drain connection of transistors 38m and 40m is high. During the precharge phase, P_PHASE is high. As the voltage at evaluation node MAT increases, the current sunk by p-channel transistor 38m decreases, while at the same time the increasing voltage at node YMS_M increases the current sunk by n-channel transistor 40m. The combined action of these events causes the voltage at the common drain connection of transistors 38m and 40m to fall. When MAT and YMS_M are close to their correct values, p-channel transistor 38m is close to being turned off and n-channel transistor 40m is well turned on. The same action occurs in detector 36r. In this way the precharge phase is directly controlled by the status of the most important signals. Moreover, the turn-off of precharge phase happens slowly, reducing possible coupling disturb due to a standard digital signal.

Figure 10:
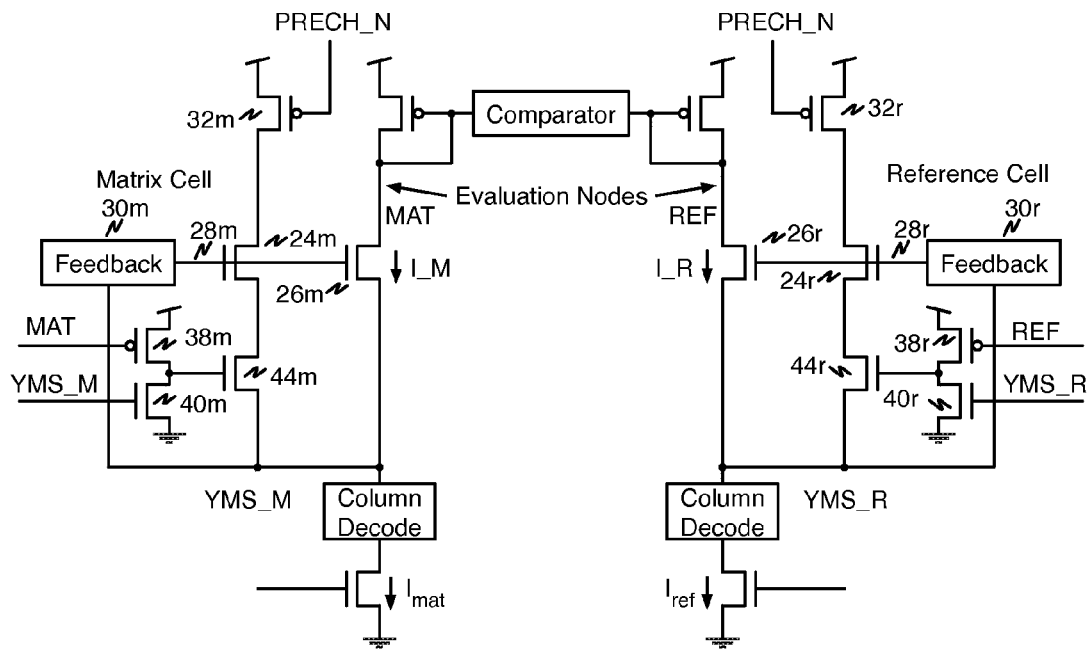
FIG. 10 is a diagram showing another illustrative embodiment of a sensing scheme according to the present invention including detector circuits according to another aspect of the present invention.

Another possible implementation is shown in FIG. 10 where the detector circuitry (which may comprise the same elements as the detector circuits of FIG. 9) uses an element such as n-channel transistor 44m to control current flow between the source of n-channel transistor 24m and the node YMS_M at the output of the feedback circuit. This current path remains open until the detector circuit changes state as disclosed with reference to the embodiment of FIG. 9. The detector circuitry may be configured to control this path with or without a desired fixed or variable voltage drop with respect to the desired target value of YMS_M, the same can be obtained or not according to the threshold of transistor 44m. The signal at the gate of n-channel transistor 44m gradually turns it off when the voltages at nodes MAT and YMS_M are close to their correct values. In this way the control works near the YMS_M node that has a large capacitance and so is more immune to commutation disturb. The operation of the circuit on the reference side is the same as described for the matrix side in that a detector (transistors 38r and 40r) using signals REF and YMS_R is used. In this case an additional logic signal PRECH_N is employed for the matrix and reference sides, but this is just one example of ways that may be used to control the precharge phase.

Another variation of the present invention comprises controlling the gates of the cascode transistors 24m, 24r, 26m, and 26r for both the matrix side and the reference side. The solution consists to add circuitry that connects respectively the gates of cascode transistors 24m, 26m, and 24r, 26r together during the precharge phase and then grounding only the gate of transistor 24m (and 24r) to turn it off at end of the precharge phase. Control of this function may be obtained by using a dedicated digital signal like PRECH_N or by use of an analog detecting signal or using both or other signals.

Figure 11:
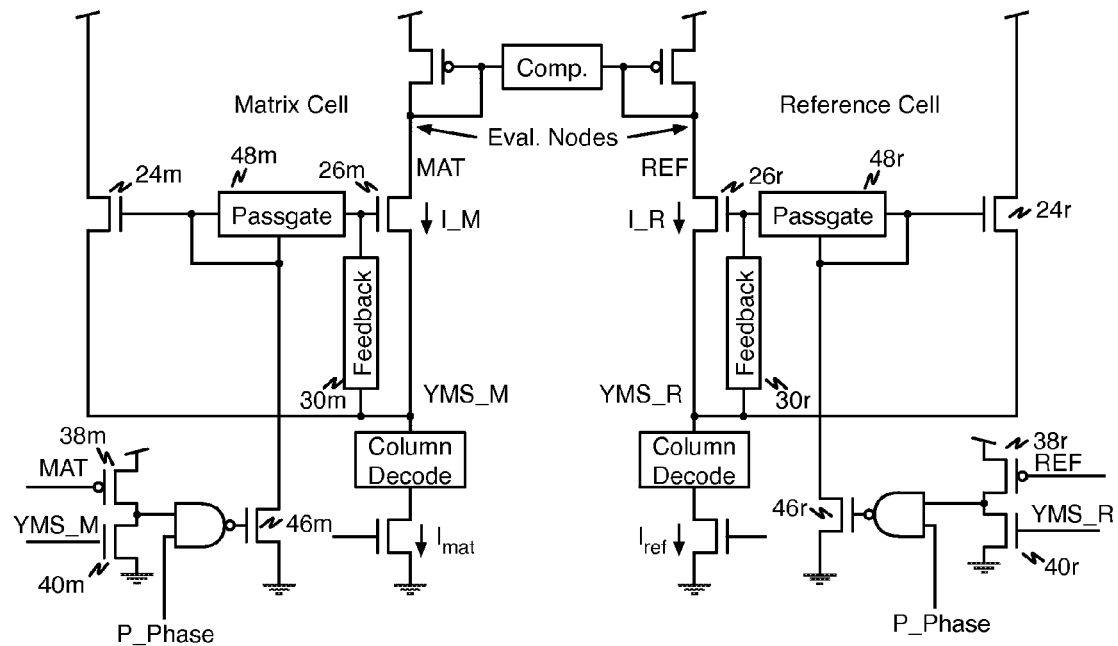
FIG. 11 is a diagram showing another illustrative embodiment of a sensing scheme according to the present invention including detector circuits according to another aspect of the present invention.

Referring now to FIG. 11, another possible implementation is shown. The gates of the two transistors cascode transistors 24m and 26m are only connected together during the precharge phase. The gate of transistor 26m is connected as in the previously-described embodiments. The gate of transistor 24m is connected to the gate of transistor 26m through passgate 48m. Passgate 48m is controlled by the output of the detector circuit including transistors 38m, 40m, NAND gate 42m and transistor 46m. During the precharge phase, the passgate is turned on and the gates of transistors 24m and 26m are tied together and are thus both controlled by feedback circuitry 30m. At the end of the precharge phase the output of NAND gate goes high, turning on transistor 46m. This action turns off the passgate 48m and grounds the gate of transistor 24m, thus turning it off. The gate of transistor 26m remains controlled by feedback circuitry 30m. The same actions occur on the reference side. The embodiment of FIG. 11 presents another possible solution for splitting the sense circuitry into optimized blocks, therefore maintaining good control of critical nodes MAT, REF, YMS_M, and YMS R.

Figure 12:
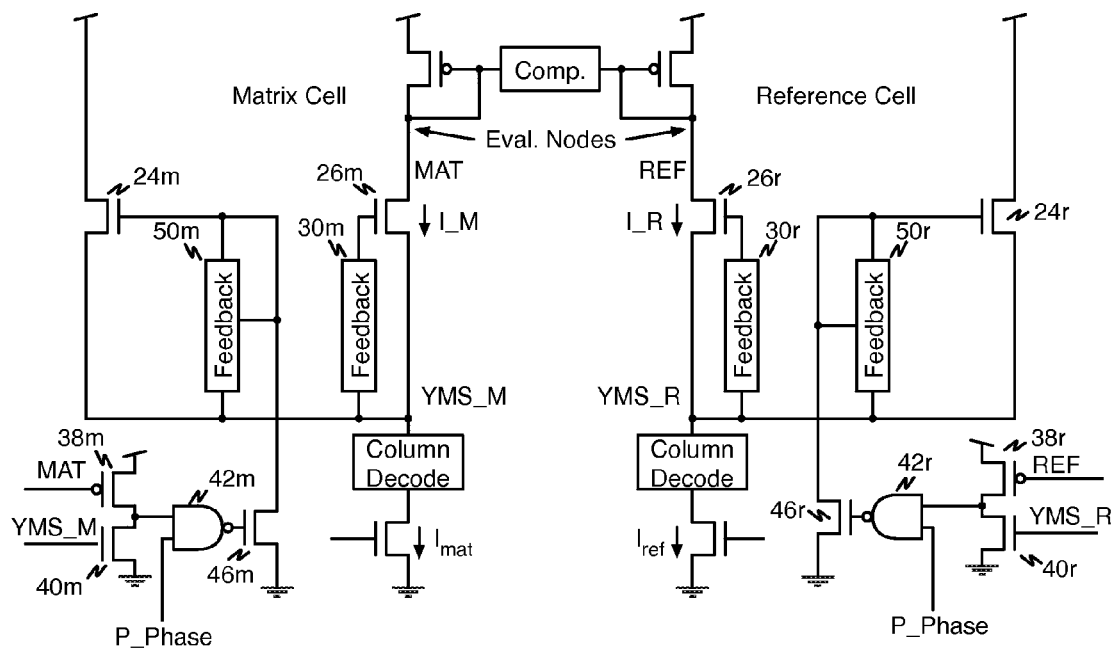
FIG. 12 is a diagram showing another illustrative embodiment of a sensing scheme according to the present invention including detector circuits according to another aspect of the present invention.

Yet another possible solution according to the present invention is shown in FIG. 12, in which the feedback control (or the fixed voltage used) for transistors 24m and 26m (and 24r and 26r) is split. From an examination of FIG. 12 it may be seen that a first feedback loop is formed as disclosed for the previous embodiments using feedback circuitry 30m to control transistor 26m. A second feedback loop is formed using feedback circuitry 50m to control transistor 24m. Control of the second feedback loop employing feedback circuitry 50m is performed by the output of the detector circuit including transistors 38m, 40m, NAND gate 42m and transistor 46m. The same circuitry is employed in the reference cell, in which a first feedback loop is formed using feedback circuitry 30r to control transistor 26r. A second feedback loop is formed using feedback circuitry 50r to control transistor 24r.

By using the circuit of FIG. 12, In this way it is possible to change and to optimize each of feedback circuitry 30m and 50m according to particular loads and currents and to either fix the same target value for YMS_M or also slightly different or different values if desired, thus providing a large measure of flexibility, better behavior and optimization. A possible example is that feedback circuit 50m quickly adjusts YMS_M to a value lower than the voltage to which feedback circuit 30m adjusts YMS_M, but any kind of other combinations are possible and flexibility is extremely high as also optimization of each circuit. Also in this case it could be used a logical phase or a detecting circuit could be used to control the feedback circuits. For example feedback circuit 50m (as well as 50r) may be turned off at the end of the precharge phase (as defined or by P_PHASE, or by the MAT and YMS_M signals, or by both together, or by other signals), along with the gates of transistors 24m (and 24r).

The approach of the present invention splits the sense circuitry into several blocks, optimizes each block (especially by currents) and makes each block operate at or near its best bias point, while maintaining very good control of all critical nodes. By using the present invention it is possible to significantly reduce the sense amplifier area, to improve sense amplifier performance, and to simplify its complex control by optimizing principal sense phases and circuitry. Persons of ordinary skill in the art will appreciate that the detecting circuitry shown could also be easily used in sensing schemes having different precharge approaches.

Figure 13:
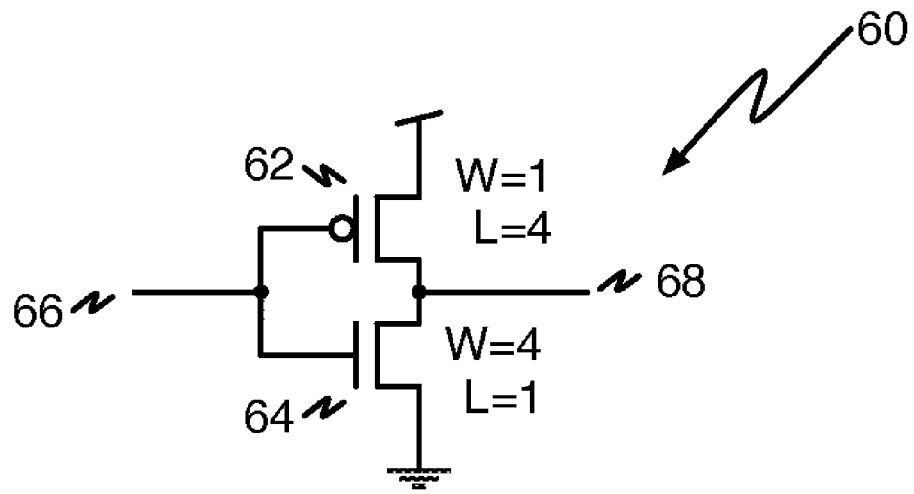
FIG. 13 is a schematic diagram of a first illustrative feedback circuit that may be used in the present invention.

Referring now to FIG. 13, a schematic diagram shows a first illustrative feedback circuit 60 that may be used in the circuits of the present invention. Persons of ordinary skill in the art will recognize that feedback circuit 60 is formed from an inverter employing p-channel transistor 62 in series with n-channel transistor 64 connected in between input node 66 and an output node 68 of the feedback circuit. In one embodiment, p-channel transistor 62 has a WL ratio of 1:4 and n-channel transistor 64 has a WL ratio of 4:1.

At the beginning the voltage at the YMS node is equal to zero, so that p-channel transistor 62 is fully on and n-channel transistor 64 is off. The voltage at the output of the feedback inverter starts to rise and exceeds the threshold of cascode transistor 26m, thus turning it on. The voltage at the YMS node starts to rise, reducing current flowing through p-channel transistor 62 and increasing the current through n-channel transistor 64 until an equilibrium point is arrived between the p-channel transistor and n-channel transistor. The sizes of the p-channel transistor and n-channel transistor are determined so as to arrive at the target value of the YMS node (about 1V). The sizes of the p-channel transistor and n-channel transistor also define the gain of the feedback circuit 60. The same feedback acts on 24*m* where the behavior is similar and it also depends on whether the transistor thresholds have been chosen to be the same or not.

Figure 14:
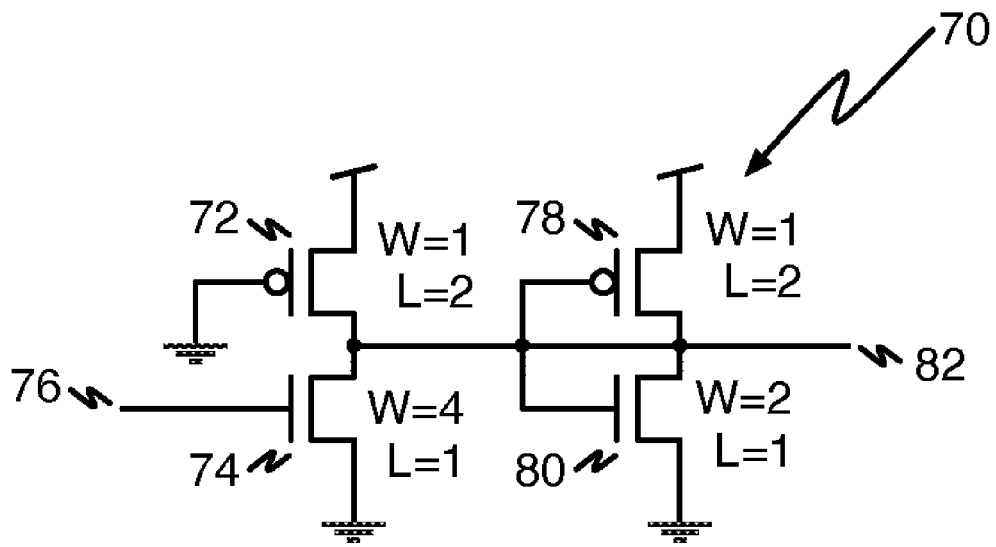
FIG. 14 is a schematic diagram of a second illustrative feedback circuit that may be used in the present invention.

Referring now to FIG. 14, a schematic diagram shows a second illustrative feedback circuit 70 that may be used in the circuits of the present invention. P-channel transistor 72 is connected in series with n-channel transistor 74. P-channel transistor 72 has its gate grounded and n-channel transistor 74 has its gate connected to the input node 76 of the feedback circuit 70. The common drain connection of transistors 72 and 74 together the drains of series connected p-channel transistor 78 and n-channel transistor 80 form the output node 82 of feedback circuit 70.

In feedback circuit 70 the YMS node acts only on n-channel transistor 74 since the gate of p-channel transistor 72 is grounded. To avoid oscillation and overshoot on the output node 82 coupled to the YMS node, p-channel transistor 78 and n-channel transistor 80 are added. In one embodiment of the circuit of FIG. 14, p-channel transistor 72 has a WL ratio of 1:2 and n-channel transistor 74 has a WL ratio of 4:1. P-channel transistor 78 has a WL ratio of 1:2 and n-channel transistor 80 has a WL ratio of 2:1. In the feedback circuit 70 of FIG. 14, the dimensions of all transistors are chosen to find an equilibrium point and value of the output node 82 of the circuit in order to obtain the target value for the YMS node (1V).

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A precharge and evaluation circuit for a memory sense amplifier comprising:
    a first precharge-phase transistor having a source coupled to a power-supply potential, a gate coupled to a precharge control line, and a drain;
    a second precharge-phase transistor having a drain coupled to the drain of the first precharge-phase transistor, a source, and a gate coupled to the source through a feedback circuit;
    a first read-phase transistor having a source coupled to the power-supply potential, and a gate and drain coupled to a comparator;
    a second read-phase transistor having a drain coupled to the drain of the first read-phase transistor, a source coupled to the source of the second precharge-phase transistor, and a gate coupled to the source of the second read-phase transistor through a feedback circuit; and
    a column decoder coupled to the sources of the second precharge-phase and second read-phase transistors.

2. The precharge and evaluation circuit of claim 1 wherein the first and second precharge-phase transistors are optimized for operation at a first range of currents and the first and second read-phase transistors are optimized for operation at a second range of currents lower than the first range of currents.

3. The precharge and evaluation circuit of claim 1 wherein the second precharge-phase transistor is configured to operate during a precharge phase of operation and the second read-phase transistor is configured to operate during the precharge phase of operation and a read phase of operation.

4. The precharge and evaluation circuit of claim 1 wherein the gate of the first precharge-phase transistor is driven by level-detecting circuitry coupled across the second precharge-phase transistor.

5. The precharge and evaluation circuit of claim 4 wherein the level-detecting circuitry comprises:
    a first transistor having a drain coupled to the power-supply potential, a gate coupled to the drain of the second precharge-phase transistor, and a source;
    a second transistor having a drain coupled to the source of the first transistor, a gate coupled to the source of the second precharge-phase transistor, and a source coupled to ground; and
    wherein the source of the first transistor and the drain of the second transistor form an output of the level-detecting circuitry and are coupled to the gate of the first precharge-phase transistor.

6. The precharge and evaluation circuit of claim 1 wherein the gate of the first precharge-phase transistor is driven by a logic timing signal.

7. The precharge and evaluation circuit of claim 1 wherein the gate of the first precharge-phase transistor is driven by level-detecting circuitry coupled across the second precharge-phase transistor logically combined with a logic timing signal.

8. The precharge and evaluation circuit of claim 7 wherein:
    the level detecting circuitry comprises a first transistor having a drain coupled to the power-supply potential, a gate coupled to the drain of the second precharge-phase transistor, and a source, a second transistor having a drain coupled to the source of the first transistor, a gate coupled to the source of the second precharge-phase transistor, and a source coupled to ground, wherein the source of the first transistor and the drain of the second transistor form an output of the level-detecting circuitry; and
    wherein the logic timing signal is combined with the output of the level-detecting circuitry in a logic gate having an output coupled to the gate of the first precharge-phase transistor.

9. The precharge and evaluation circuit of claim 1 wherein the feedback circuit comprises an inverter having a p-channel transistor in series with an n-channel transistor coupled between an input node and an output node.

10. The precharge and evaluation circuit of claim 9 wherein:
    the p-channel transistor has a WL ratio of about 1:4 and
    the n-channel transistor has a WL ratio of about 4:1.

11. The precharge and evaluation circuit of claim 1 wherein the feedback circuit comprises:
    a p-channel transistor having a source coupled to a voltage supply, a gate coupled to ground, and a drain coupled to an output node;
    an n-channel transistor having a source coupled to ground, a gate coupled to an input node, and a drain coupled to the drain of the first p-channel transistor;
    a diode connected p-channel transistor having a source coupled to a voltage source and a gate and drain coupled to the output node; and
    a diode connected n-channel transistor having a source coupled to ground and a gate and drain coupled to the output node.

12. The precharge and evaluation circuit of claim 11 wherein:
    the p-channel transistor has a WL ratio of about 1:2;
    the n-channel transistor has a WL ratio of about 4:1;
    the diode-connected p-channel transistor has a WL ratio of about 1:2 and
    the diode-connected n-channel transistor has a WL ratio of about 2:1.

* * * * *